US011835957B2

(12) United States Patent
Wang et al.

(10) Patent No.: US 11,835,957 B2
(45) Date of Patent: Dec. 5, 2023

(54) SELF-PROPELLED DEVICE SYSTEM AND BOUNDARY WIRE BREAK DETECTION METHOD THEREOF

(71) Applicant: Nanjing Chervon Industry Co., Ltd., Nanjing (CN)

(72) Inventors: Hongwei Wang, Nanjing (CN); Dezhong Yang, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 372 days.

(21) Appl. No.: 17/133,758

(22) Filed: Dec. 24, 2020

(65) Prior Publication Data

US 2021/0200226 A1 Jul. 1, 2021

(30) Foreign Application Priority Data

Dec. 26, 2019 (CN) .......................... 201911371219.1

(51) Int. Cl.
*G05D 1/02* (2020.01)
*A01D 34/00* (2006.01)
*G01R 31/54* (2020.01)
*A01D 101/00* (2006.01)

(52) U.S. Cl.
CPC ......... *G05D 1/0212* (2013.01); *A01D 34/008* (2013.01); *G01R 31/54* (2020.01); *G05D 1/0259* (2013.01); *A01D 2101/00* (2013.01); *G05D 2201/0208* (2013.01)

(58) Field of Classification Search
CPC ............... G05D 1/0212; G05D 1/0259; G05D 2201/0208; G05D 1/0265; G05D 1/0219; G05D 2201/0201; A01D 34/008; A01D 2101/00; G01R 31/54; G01R 33/02; G01S 19/42
See application file for complete search history.

(56) References Cited

U.S. PATENT DOCUMENTS

| | | | |
|---|---|---|---|
| 2011/0202307 A1* | 8/2011 | Petereit ................ | G05D 1/0265 702/150 |
| 2020/0278691 A1* | 9/2020 | Dalfra .................. | G05D 1/0259 |
| 2021/0272438 A1* | 9/2021 | Askenmalm ......... | G05D 1/0259 |

* cited by examiner

*Primary Examiner* — Aniss Chad
*Assistant Examiner* — Chase L Cooley
(74) *Attorney, Agent, or Firm* — Greenberg Traurig, LLP

(57) ABSTRACT

A self-propelled device system includes a self-propelled device, a boundary wire configured to define a work area of the self-propelled device and a signal transmitting unit electrically connected with the boundary wire configured to generate and send a boundary signal to the boundary wire that generates a magnetic field when flowing through the boundary wire. The self-propelled device has a signal receiving module and a control module. The signal receiving module uses the magnetic field caused by the boundary signal to generate a boundary wire inductive signal and the control module determines that the boundary wire has a wire break when a relevant parameter of the boundary wire inductive signal is less than or equal to a predefined threshold.

14 Claims, 6 Drawing Sheets

SELF-PROPELLED DEVICE SYSTEM AND BOUNDARY WIRE BREAK DETECTION METHOD THEREOF

RELATED APPLICATION INFORMATION

This application claims the benefit of CN 201911371219.1, filed on Dec. 26, 2019, the disclosure of which is incorporated herein by reference in its entirety.

BACKGROUND

This disclosure relates to a garden tool, in particular to a self-propelled device system and a boundary wire break detection method thereof.

Generally, self-propelled devices such as lawn mowers and other outdoor gardening cutting tools are provided with operating handles for pushing; the operating handles are provided with switch boxes and control mechanisms near the grip portion to facilitate operators' operation and control. A lawn mower relies on the thrust applied by the operator to the operating handle to travel on the ground and perform cutting operations, which is very labor-intensive. With the continuous development of artificial intelligence, self-propelled devices that can walk, i.e., move, on their own have also been developed. Since the self-propelled device can walk automatically and perform certain predetermined tasks without human operation and intervention, it greatly saves manpower and material resources and brings convenience to the operator.

The emergence of self-propelled device has brought great convenience to users, allowing users to free themselves from the heavy gardening work. However, the self-propelled device generally moves within a boundary wire, and the boundary wire is connected with the signal transmitting unit. The signal transmitting unit generates a boundary signal and sends it to the boundary wire. The self-propelled device recognizes the boundary signal to control the self-propelled device to move within the boundary wire. However, when the boundary wire has a wire break problem, it is difficult to quickly locate the wire break position, thereby affecting the operation of the self-propelled device.

SUMMARY

A self-propelled device system, including: a boundary wire configured to define a work area of the self-propelled device; a signal transmitting unit electrically connected with the boundary wire, and configured to generate and send a boundary signal to the boundary wire, the boundary signal being enabled to generate a magnetic field when flowing through the boundary wire; and a self-propelled device, including: a signal receiving module for inducing a magnetic field change caused by the boundary signal to generate a boundary wire inductive signal; and a control module for receiving the boundary wire inductive signal and determining whether the boundary wire has a wire break. If a relevant parameter of the boundary wire inductive signal is less than or equal to a predefined threshold, determine that the boundary wire has a wire break.

Optionally, the boundary signal is an alternating current signal.

Optionally, the self-propelled device includes work modes of a fully automatic mowing mode and a wire break detection mode.

Optionally, the control module is further configured to: perform a multiply-add operation on the boundary wire inductive signal with the sine function or cosine function to obtain an amplitude of the boundary wire inductive signal;

if the amplitude of the boundary wire inductive signal is less than or equal to a first predefined threshold, determine that the boundary wire has a wire break.

Optionally, in the wire break detection mode, the operation of the self-propelled device includes two steps of returning to the signal transmitting unit and walking along the boundary wire.

Optionally, the control module is configured to: in the wire break detection mode, control the self-propelled device to return to the signal transmitting unit; control the self-propelled device to walk along the boundary wire according to the boundary wire inductive signal; determine that a position of the boundary wire where the self-propelled device is located is a wire break position if an amplitude of the boundary wire inductive signal is less than or equal to a second predefined threshold.

Optionally, the self-propelled device further includes:
an interactive interface communicatively connected with the control module; the interactive interface is configured to display the operating status information of the self-propelled device, and the user can control the start and work mode of the self-propelled device through the interactive interface.

Optionally, the control module is configured to:
if an amplitude of the boundary wire inductive signal is less than or equal to a first predefined threshold, send a wire break prompt signal to the interactive interface to remind the user that the boundary wire has a wire break.

Optionally, the control module is configured to:
if an amplitude of the boundary wire inductive signal is less than or equal to a second predefined threshold, send a position prompt signal to the interactive interface to prompt the user of the wire break position of the boundary wire.

Optionally, the interactive interface can be provided on a mobile terminal.

Optionally, the self-propelled device further includes:
a mobile station to capture the GNSS or GPS position of the self-propelled device;
the control module is configured to:
obtain the GNSS or GPS position of the self-propelled device and output a corresponding control instruction to a walking assembly of the lawn mower to control the self-propelled device to move to the position of the signal transmitting unit.

A wire break detection method for a boundary wire of a self-propelled device system, the self-propelled device system includes: a boundary wire configured to define a work area of the self-propelled device; a signal transmitting unit, electrically connected with the boundary wire, for generating and sending a boundary signal to the boundary wire, and the boundary signal can generate a magnetic field when flowing through the boundary wire; and a self-propelled device; the wire break detection method includes the following steps: inducing the magnetic field generated when the boundary signal flows through the boundary wire; calculating an amplitude of the boundary wire induction signal; and determining that the boundary wire has a wire break if the amplitude of the boundary wire inductive signal is less than or equal to a first predefined threshold.

Optionally, the wire break detection method further includes: controlling the self-propelled device to walk along the boundary wire; inducing the magnetic field generated when the boundary signal flows through the boundary wire; calculating the amplitude of the boundary wire inductive signal; and determining that a position of the boundary wire where the self-propelled device is located is a wire break position if the amplitude of the boundary wire inductive signal is less than or equal to a second predefined threshold.

DETAILED DESCRIPTION

Figure 1:
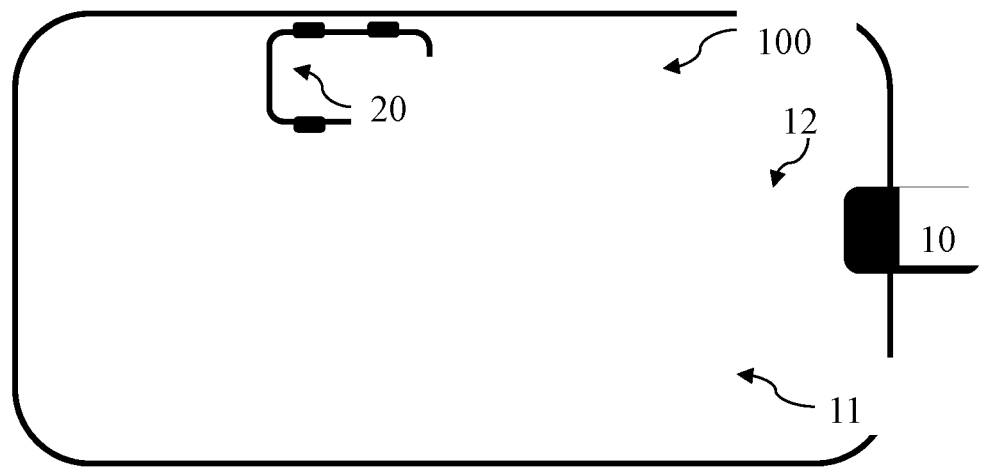
FIG. 1 is a schematic diagram of an intelligent mowing system according to one example.

A self-propelled device system, taking an intelligent mowing system as an example, refer to the intelligent mowing system 100 shown in FIG. 1, which includes a boundary module 10 and an intelligent lawn mower 20. The boundary module 10 includes a boundary wire 11 and a signal transmitting unit 12. The boundary wire 11 is used to define the work area of the intelligent lawn mower 20, wherein the area located within the boundary wire 11 is the work area and the area located outside the boundary wire 11 is the non-working area, and the boundary wire 11 can be disposed on the ground. The signal transmitting unit 12 is electrically connected with the boundary wire 11. The signal transmitting unit 12 generates a boundary signal BS and sends it to the boundary wire 11. When the boundary signal BS flows through the boundary wire 11, a magnetic field is generated. It can be understood that the boundary signal BS may be a current signal. In some examples, the signal transmitting unit 12 periodically provides an alternating current signal to the boundary wire 11, and an alternating magnetic field is generated when the current signal flows through the boundary wire 11. Specifically, the signal transmitting unit 12 may be a charging pile, which can periodically provide an alternating current signal to the boundary wire 11, and also charge the intelligent lawn mower 20. It can be understood that the self-propelled device system may also be an automatic snow blower system, etc., which is not limited here.

Figure 2:
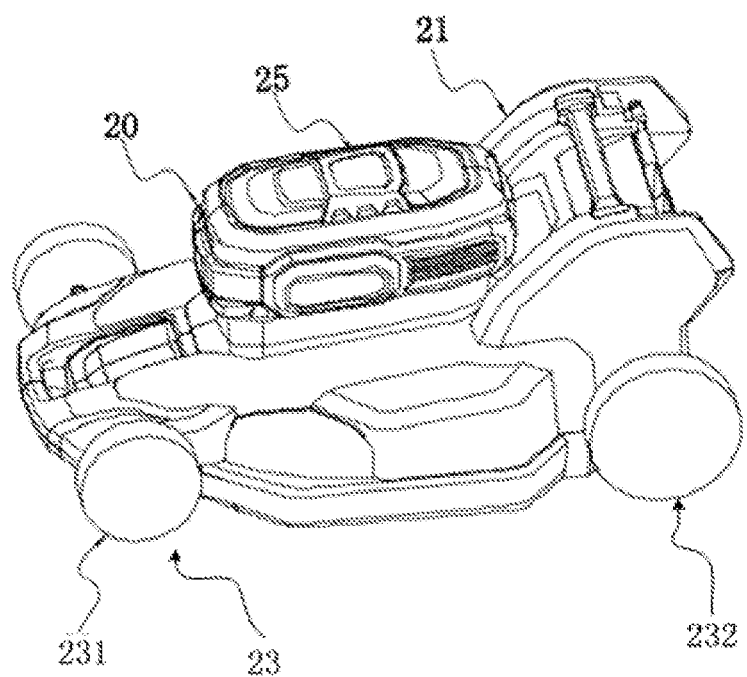
FIG. 2 is a schematic structural diagram of an intelligent lawn mower in the intelligent mowing system shown in FIG. 1.
Figure 3:
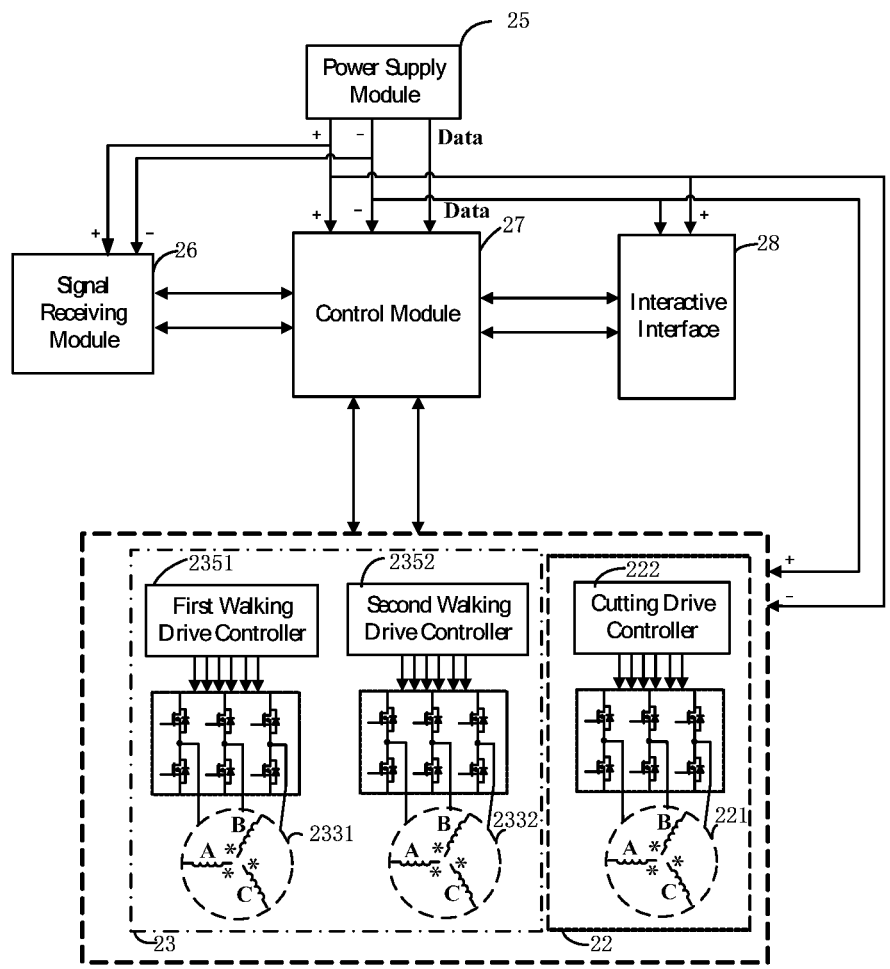
FIG. 3 is a circuit block diagram of the intelligent lawn mower shown in FIG. 2.

Referring to FIGS. 2 and 3, the intelligent lawn mower 20 at least includes a body 21, a cutting assembly 22 and a walking assembly 23.

The cutting assembly 22 is generally installed under the body 21 for cutting grass or vegetation. Specifically, it may include a cutting element (not shown) for realizing the cutting function, a cutting motor 221 for driving the cutting element to rotate at a high speed, and a cutting drive controller 222 for controlling the cutting motor. The cutting assembly 22 may include more than one cutting elements, and correspondingly, the number of the cutting motors 221 may correspond to the number of cutting elements.

The walking assembly 23, supported by the body 21 and rotatable, is configured to enable the intelligent lawn mower 20 to walk on the lawn. The walking assembly 23 includes a walking wheel. In some examples, the walking wheel includes a first walking wheel 231 and a second walking wheel 232, and the cutting element is located between the first walking wheel 231 and the second walking wheel 232. The number of the first walking wheels 231 is two, and the number of the second walking wheels 232 is also two. The second walking wheels 232 include a left walking wheel 2321 and a right walking wheel 2322. The walking assembly 23 also includes a walking motor 233, which is configured to drive the second walking wheel 232. The number of walking motors is also two, which are respectively the left walking motor 2331 driving the left walking wheel 2321 and the right walking motor 2332 driving the right walking wheel 2322. The walking assembly 23 further includes a walking drive controller 235 for controlling the walking motor 233. The walking drive controller 235 includes: a first walking drive controller 2351 and a second walking drive controller 2352. Specifically, the first walking drive controller 2351 is used to drive the corresponding left walking motor 2331; the second walking drive controller 235 is used to control the corresponding right walking motor 2332. In this way, when the two walking motors drive the respective second walking wheels 232 to rotate at different speeds, a speed difference occurs between the left walking wheel 2321 and the right walking wheel 2322, so that the intelligent lawn mower 20 can make a turn.

The intelligent lawn mower 20 also includes a power supply module 25, which supplies power to the intelligent lawn mower 20. Optionally, the power supply module 25 is implemented as at least one battery pack, which is connected to the intelligent lawn mower 20 through the battery pack interface of the intelligent lawn mower 20 to provide electric power to the cutting motor 221 and the walking motor 233. The power supply circuit is electrically connected with the power supply module 25 and the motor, so that the electrical energy output from the power supply device is provided to the motor to drive the cutting assembly 22 and the walking assembly 23. It is worth mentioning that the intelligent lawn mower 20 can choose a fully automatic mowing mode or a manual mowing mode, that is, the user manually controls the intelligent lawn mower 20 to perform operations.

The intelligent lawn mower 20 is also provided with an interactive interface 28 for interacting with the user. The interactive interface 28 can display the operating status information of the intelligent lawn mower 20, and is provided with buttons or switches for the user to control the start and operation of the intelligent lawn mower. In some examples, the interactive interface 28 is connected to the control module 27. When the user transmits control commands through buttons or switches, the control module 27 obtains, analyzes and outputs corresponding control commands to corresponding controllers to control the operation of the intelligent lawn mower 20. The interactive interface 28 and the control module 27 are communicably connected, and such a connection can be implemented in any suitable manner, including but not limited to wired or wireless connection. The interactive interface 28 can also be configured on a mobile terminal such as a mobile phone, so that a user can monitor and control the intelligent lawn mower 20 through a mobile terminal such as a mobile phone, which is very convenient.

Figure 4:
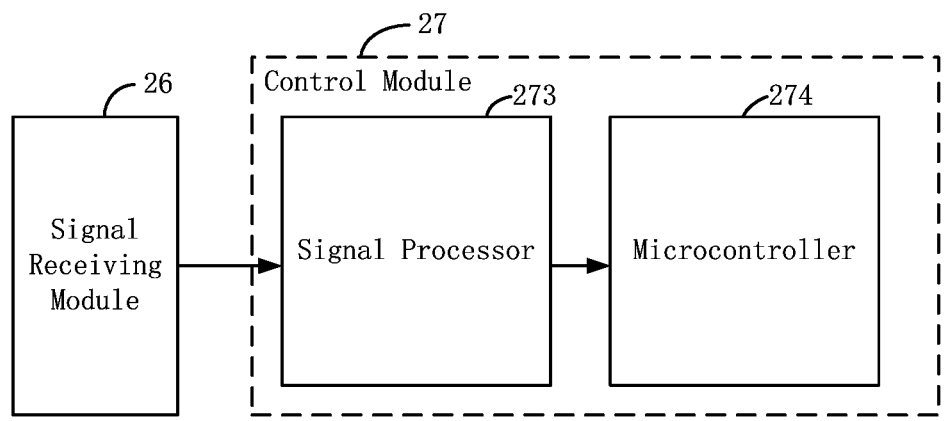
FIG. 4 is a structural diagram of a control module of the intelligent lawn mower.

Referring to FIG. 4, the intelligent lawn mower 20 further includes a signal receiving module 26 and a control module 27. The signal receiving module 26 is configured to induce the magnetic field changes generated by said boundary signal and generate a boundary wire inductive signal MS. The signal receiving module 26 can convert the magnetic field into a corresponding electrical signal. In some examples, the signal receiving module 26 includes an inductor, which induces a magnetic field and generates a corresponding electromotive force, thereby converting the magnetic field into a boundary wire inductive signal MS and passing it to the control module 27. In other examples, the signal receiving module 26 includes a magnetic field detection sensor, which can detect an alternating magnetic field and convert it into an electrical signal output.

The control module 27 is configured to receive the boundary wire inductive signal MS, and control the intelligent lawn mower 20 to walk based on a relevant parameter of the boundary wire inductive signal MS. In some examples, the intelligent lawn mower is controlled to enter the wire break detection mode when the relevant parameter of the boundary wire inductive signal is less than or equal to a predefined threshold.

The control module 27 is configured to determine whether the intelligent lawn mower 20 is in the work area within the boundary wire 11 based on the phase or change of the boundary wire inductive signal; the control module 27 is also configured to determine The distance between the intelligent lawn mower 20 and the boundary wire 11 based on the amplitude of the boundary wire inductive signal MS. The intelligent lawn mower 20 further selects a work mode based on the amplitude of the boundary wire inductive signal MS so as to send control signals to the walking drive controller to control the movement of the intelligent lawn mower 20, wherein the movement modes include: fully automatic mowing mode and wire break detection mode.

The control module 27 further includes a signal processor 273 and a microcontroller 274. The signal processor 273 is connected with the signal receiving module 26 for receiving the boundary wire inductive signal MS, processing the boundary wire inductive signal MS and transmitting the processed signal PS to the microcontroller 274. The microcontroller 274 receives the boundary wire inductive signal MS to calculate the amplitude and phase of the boundary wire inductive signal MS, so as to determine the distance between the intelligent lawn mower 20 and the boundary wire 11, and whether the intelligent lawn mower 20 is in the work area inside the boundary wire 11 or the non-working area outside the boundary wire 11. In some examples, after the microcontroller 274 receives the boundary wire inductive signal MS, it may perform multiply-add operations on the waveform function of the boundary wire inductive signal MS with the sine function or the cosine function to calculate the amplitude and the phase of the boundary wire inductive signal MS to determine the distance between the intelligent lawn mower 20 and the boundary wire 11, and whether the intelligent lawn mower 20 is in the work area inside the boundary wire 11 or the non-working area outside the boundary wire 11, and control the walking direction of the intelligent lawn mower 20 according to the results. The microcontroller 274 is also configured to compare the amplitude of the boundary wire inductive signal MS with a predefined threshold stored in advance to select the work mode of the intelligent lawn mower.

Figure 5:
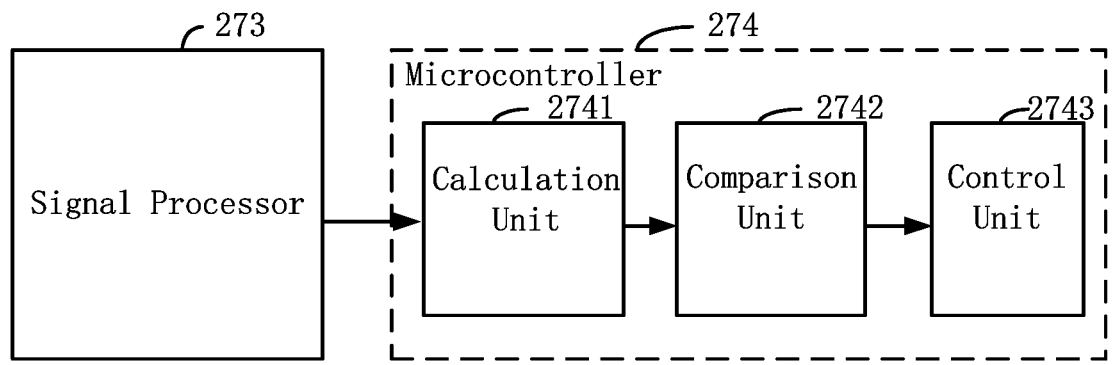
FIG. 5 is a structural diagram of a microcontroller of the intelligent lawn mower.

Specifically, referring to FIG. 5, the microcontroller 274 further includes a calculation unit 2741, a comparison unit 2742, and a control unit 2743.

The calculation unit 2741 is connected with the signal processor 273, and calculates the amplitude and phase of the boundary wire inductive signal MS according to the processed signal PS, and transmits the calculated signal to the comparison unit 2742, and compares the amplitude of the boundary wire inductive signal MS with a first predefined threshold stored in advance. If the amplitude of the boundary wire inductive signal MS is greater than the first predefined threshold, the comparison unit 2742 sends a first control signal to the control unit 2743 to control the intelligent lawn mower 20 to work in the fully automatic mowing mode, which automatically performs mowing within the boundary wire 11.

If the comparison unit 2742 finds that the amplitude of the boundary wire inductive signal MS is less than or equal to the first predefined threshold, it determines that the boundary wire 11 has a wire break, i.e., there is a wire break position on the boundary wire 11, and the comparison unit 2742 sends a second control signal to the control unit to control the intelligent lawn mower 20 to enter the wire break detection mode. In the wire break detection mode, the operation of the intelligent lawn mower 20 has two steps: returning to the signal transmitting unit 12 and walking along the boundary wire 11. After the intelligent lawn mower 20 enters the wire break detection mode, the control module 27 sends a control signal to the walking assembly to control the intelligent lawn mower 20 to first return to the signal transmitting unit 12, then walk along the boundary wire 11, and then search for the wire break position on the boundary wire 11 according to the amplitude of the boundary wire inductive signal MS.

Specifically, the control module 27 detects that the amplitude of the boundary wire inductive signal MS is less than or equal to the first predefined threshold and sends a wire break prompt signal to the interactive interface 28 to remind the user that the boundary wire 11 may have a wire break. The user switches the intelligent lawn mower 20 to the wire break detection mode through the interactive interface 28, and the user can manually move the intelligent lawn mower to the signal transmitting unit 12. In other examples, the user controls the intelligent lawn mower 20 through the interactive interface 28 to automatically return to the signal transmitting unit 12. For example, the user make a select on the interactive interface 28 to make the intelligent lawn mower enter the wire break detection mode, and the interactive interface 28 transmits the return command to the control module 27, and the control module 27 obtains, analyzes, and outputs corresponding control commands to the walking assembly 23 to control the intelligent lawn mower to return to the signal transmitting unit 12.

Figure 6:
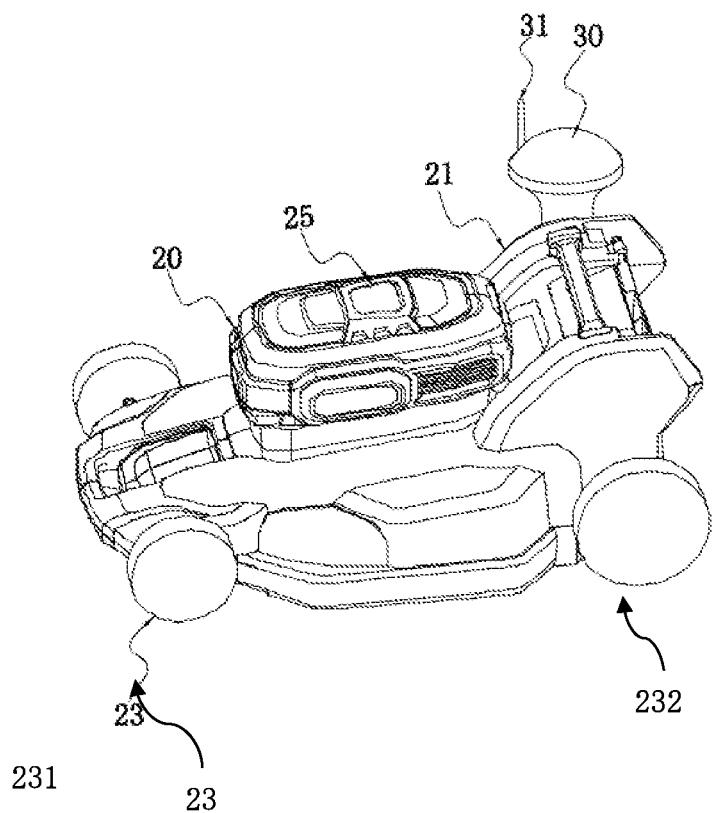
FIG. 6 is a schematic structural diagram of an intelligent lawn mower according to another example.

As shown in FIG. 6, in some examples, the intelligent lawn mower 20 is further provided with a mobile station 30, and the mobile station 30 moves with the intelligent lawn mower 20 to capture the GNSS or GPS position of the intelligent lawn mower 20. The mobile station 30 includes a receiving antenna 31 to receive GNSS or GPS position signals from satellites, thereby determining the position of the intelligent lawn mower 20. The user sends the return instruction to the control module 27 through a one-key return button. The control module 27 obtains the GNSS or GPS position signals received by the mobile station 30, and outputs the corresponding control instruction to the walking assembly 23 to control the movement of the intelligent lawn mower 20 to the predefined coordinate position of the signal transmitting unit 12. It is understood that the GNSS or GPS position is represented by the coordination of the longitude position and the latitude position. For example, the obtained GNSS or GPS position may be 31°51' longitude and 118°48' latitude, then the GNSS or GPS position is represented as (N 31°51', E 118°48'). The mobile station 30 may be detachably mounted to the intelligent lawn mower 20.

After the intelligent lawn mower 20 returns to the position of the transmitting unit 12, it walks along the boundary wire 11, and searches for the wire break position according to the amplitude of the boundary wire inductive signal MS.

Figure 7:
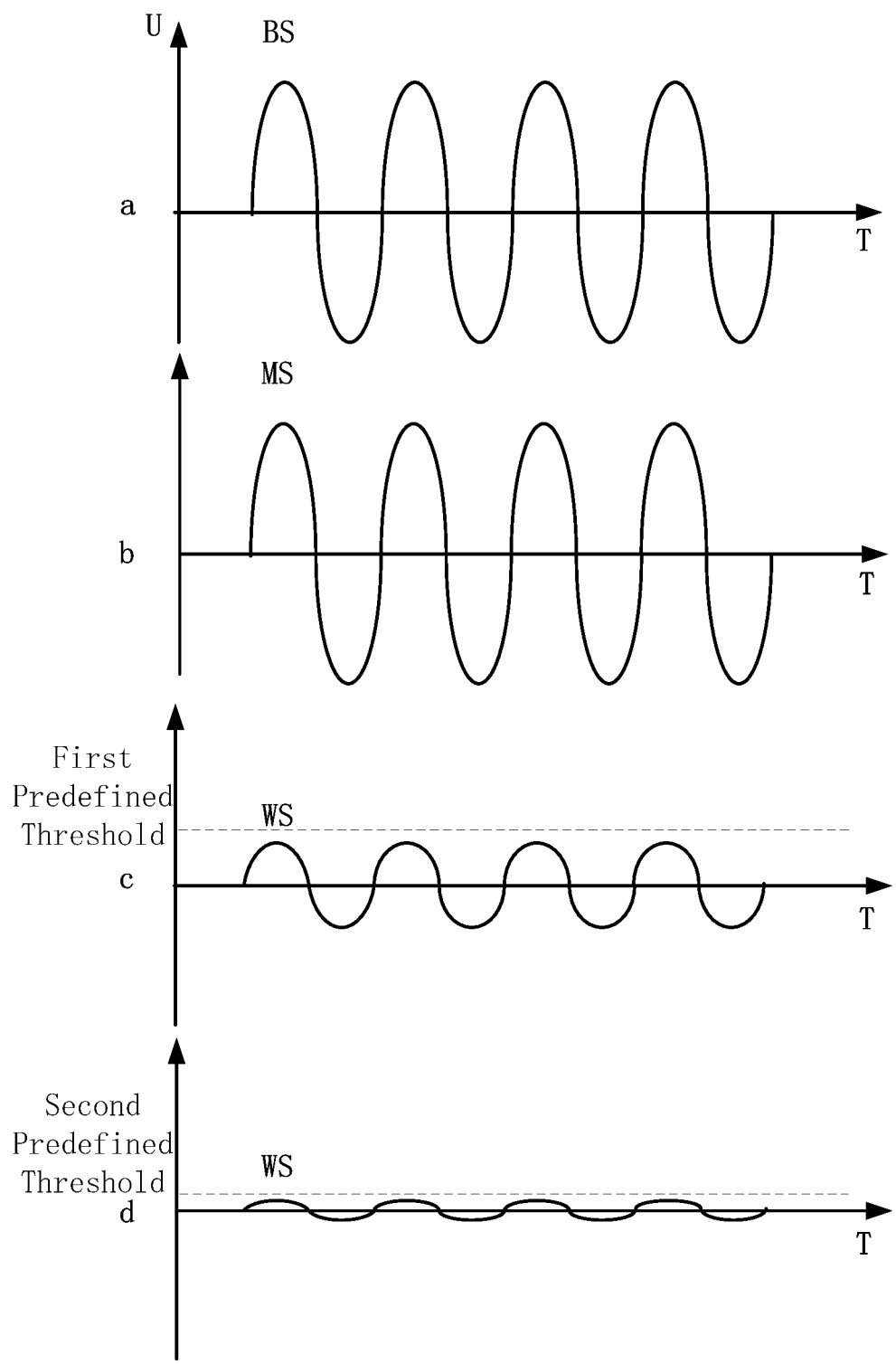
FIG. 7 illustrates boundary signal waveform diagrams.

Referring to FIG. 7, in an example, the signal transmitting unit 12 periodically provides an alternating current signal to the boundary wire 11. Although a closed loop cannot be formed due to the existence of a wire break position on the boundary wire 11, still there is a changing voltage signal on the boundary wire 11, and the changing voltage signal generates a magnetic field. When the intelligent lawn mower 20 approaches the boundary wire 11, the signal receiving module 26 induces the change in the magnetic field and generates the boundary wire inductive signal WS. It can be understood that the signal strength of the boundary wire inductive signal WS when the boundary wire is broken is less than the signal strength of the boundary wire inductive signal MS when the boundary wire is normal. Therefore, when the boundary wire is broken, the control module 27 detects that the amplitude of the boundary wire inductive signal WS is lower than the amplitude of the boundary wire inductive signal MS. In this example, the boundary signal BS is a sine wave signal. It can be understood that the boundary signal BS is not limited to a sine wave signal.

When the intelligent lawn mower 20 is walking along the boundary wire 11, and the control module 27 detects that the amplitude of the boundary wire inductive signal WS is less than a second predefined threshold, it is determined that the location of the intelligent lawn mower 20 is the wire break position of the boundary wire. Specifically, the signal receiving module 26 induces the magnetic field and generates the boundary wire inductive signal WS. The signal processor 273 receives the boundary wire inductive signal WS, processes and transmits the processed signal PS' to the microcontroller 274. The calculation unit 2741 in the microcontroller 274 calculates the amplitude and phase of the boundary wire inductive signal WS based on the processed signal PS' and transmits them to the comparison unit 2742. The comparison unit 2742 compares the amplitude of the boundary wire inductive signal WS with the second predefined threshold stored in advance: when the amplitude of the boundary wire inductive signal WS is less than or equal to the second predefined threshold, it is determined that the intelligent lawn mower 20 is at a wire break position on the boundary wire 11, and the comparison unit 2742 sends a stop control signal to the control unit to control the intelligent lawn mower 20 to stop moving. In some examples, the control module 27 further sends a position prompt signal to the interactive interface 28 to display the wire break position to the user. It is understandable that when the control module 27 detects the wire break position on the boundary wire 11, it sends a position prompt signal to make the intelligent lawn mower send position prompt information or perform physical actions that can be sensed by the user, for example, after the intelligent lawn mower 20 detects the wire break position, the intelligent lawn mower 20 may stop moving and continuously flash the indicator light provided on the intelligent lawn mower to prompt the user of the position of the intelligent lawn mower 20.

The signal processor 273 further includes: a filtering unit 2731 and an amplifying unit 2732.

The filtering unit 2731 is connected with the signal receiving module 26 and is configured to filter the boundary wire inductive signal; the amplifying unit 2732 is configured to amplify the filtered signal to obtain the final processed signal PS'. The amplifying unit 2732 and the calculation unit 2741 are connected.

In this way, the intelligent lawn mower can quickly determine whether the boundary wire has a wire break according to the amplitude of the boundary wire inductive signal MS, and can accurately and quickly detect the wire break position automatically, which effectively improves the detection efficiency and saves manpower.

Figure 8:
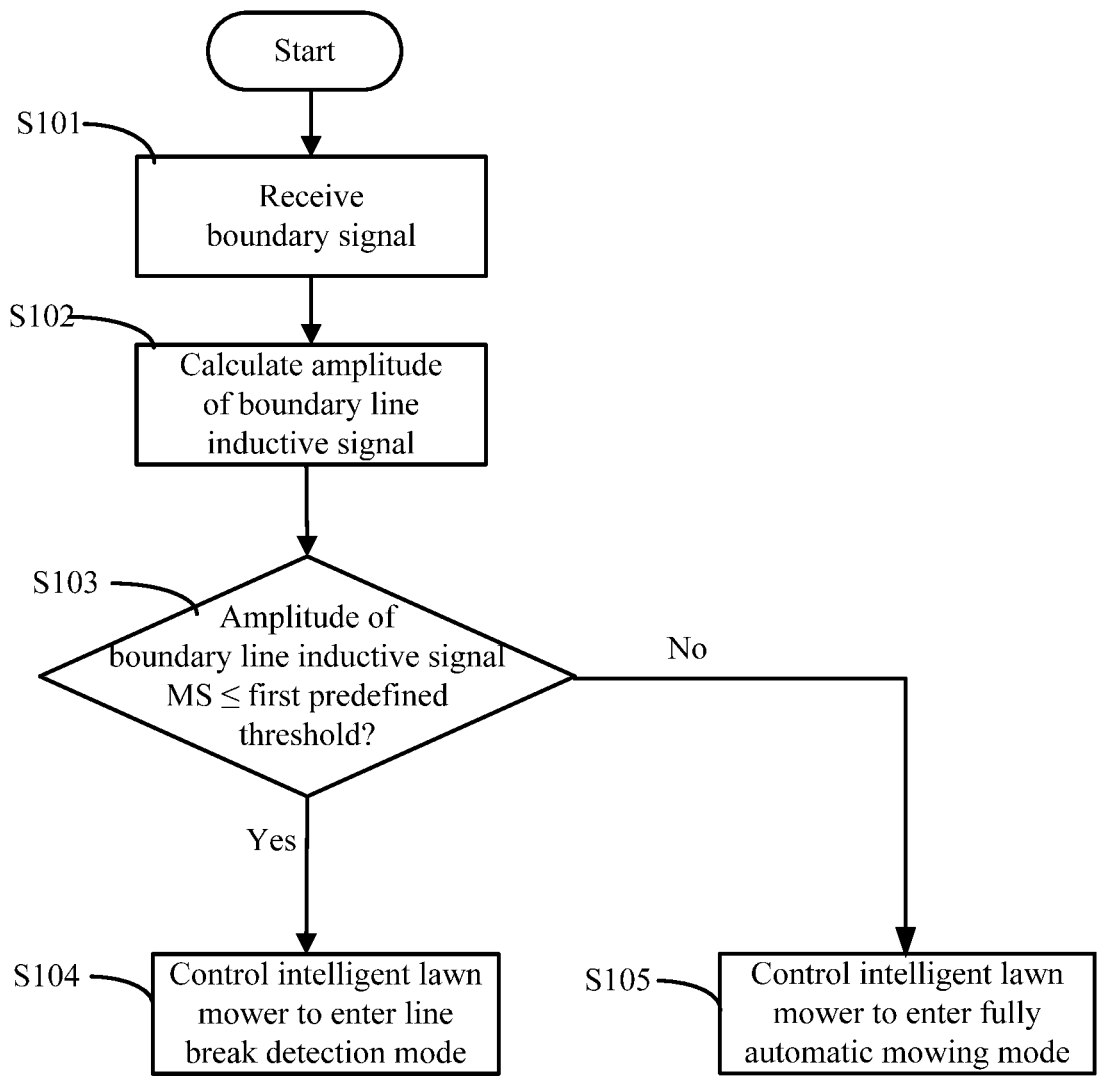
FIG. 8 is a flowchart of a method for the intelligent lawn mower to determine whether the boundary wire has a wire break.

Referring to FIG. 8, a schematic flowchart of the method for the intelligent lawn mower 20 to determine whether the boundary wire 11 has a wire break includes the following steps:

In step S101, induce the magnetic field generated when the boundary signal flows through the boundary. The signal transmitting unit 12 generates a boundary signal BS and sends it to the boundary wire 11. When the boundary signal BS flows through the boundary wire 11, a magnetic field is generated. The signal receiving module 26 can induce the change of the magnetic field caused by the boundary wire and generate a boundary wire inductive signal MS.

In step S102, calculate the amplitude of the boundary wire inductive signal MS. The control module 27 is configured to receive the boundary wire inductive signal MS. The signal processor 273 in the control module 27 is configured to receive the boundary wire inductive signal MS and generate a processed signal PS. The microcontroller 274 in the control module 27 is configured to receive the processed signal PS, and the calculation unit 2741 in the microcontroller 274 is configured to calculate the amplitude of the boundary wire inductive signal MS according to the processed signal PS.

In step S103, determine whether the amplitude of the boundary wire inductive signal MS is less than or equal to a first predefined threshold. The comparison unit 2742 compares the amplitude of the boundary wire inductive signal MS with the first predefined threshold stored in advance, and if the amplitude is less than or equal to the first predefined threshold, execute S104; if not, execute S105.

In step S104, control the intelligent lawn mower 20 to enter the wire break detection mode. The comparison unit 2742 sends a second control signal to the control unit to send a wire break prompt signal to the interactive interface 28 to prompt the user that the boundary wire 11 may have a wire break, and the user switches the intelligent lawn mower 20 to the wire break detection mode through the interactive interface 28.

In step S105, control the intelligent lawn mower to enter the fully automatic mowing mode. The comparison unit 2742 sends a first control signal to the control unit 2743 to control the intelligent lawn mower 20 to work in the fully automatic mowing mode, which automatically performs mowing within the boundary wire 11 to trim the lawn.

Figure 9:
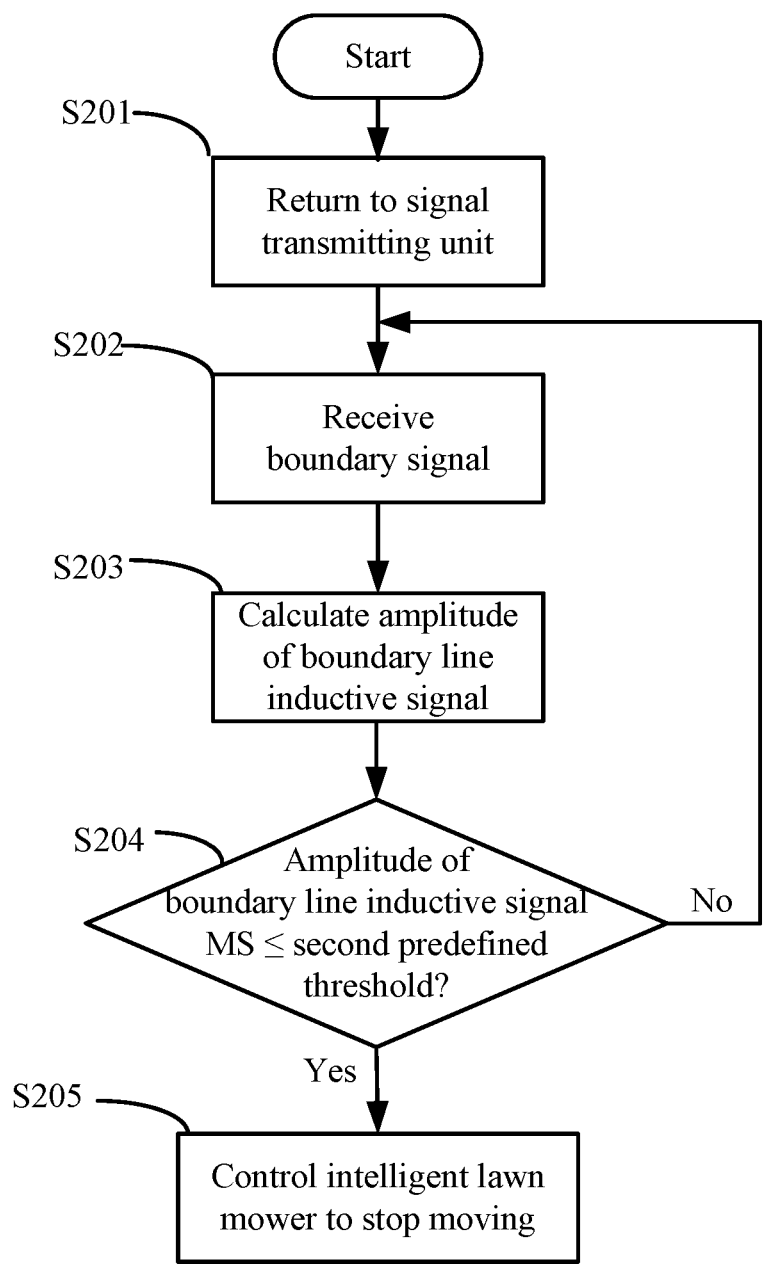
FIG. 9 is a flowchart of a method for the intelligent lawn mower to search for a wire break position of the boundary wire.

Referring to FIG. 9, a schematic flowchart of the method for the intelligent lawn mower 20 to search for the wire break position in the wire break detection mode includes the following steps:

In step S201, the intelligent lawn mower 20 returns to the signal transmitting unit 12, and starts to walk along the boundary wire 11 from the signal transmitting unit 12. In some examples, the user manually moves the intelligent lawn mower to the signal transmitting unit 12; in other examples, the intelligent lawn mower 20 automatically returns to the signal transmitting unit 12 in the wire break detection mode.

In step S202, induce the magnetic field generated when the boundary signal flows through the boundary. The signal transmitting unit 12 generates a boundary signal BS and sends it to the boundary wire 11. When the boundary signal BS flows through the boundary wire 11, a magnetic field is generated. The intelligent lawn mower 20 walks along the boundary wire 11, and the signal receiving module 26 induces a magnetic field change caused by the boundary wire 11, and generates the boundary wire inductive signal WS.

In step S203, calculate the amplitude of the boundary wire inductive signal WS. The control module 27 is configured to receive the boundary wire inductive signal WS. The signal processor 273 in the control module 27 is configured to receive the boundary wire inductive signal WS and generate a processed signal PS'. The microcontroller 274 in the control module 27 is configured to receive the processed signal PS', and the calculation unit 2741 in the microcontroller 274 is configured to calculate the amplitude of the boundary wire inductive signal WS according to the processed signal PS'.

In step S204, determine whether the amplitude of the boundary wire inductive signal WS is less than the second predefined threshold. The comparison unit 2742 compares the amplitude of the boundary wire inductive signal WS with the second predefined threshold stored in advance, and if the amplitude is less than or equal to the second predefined threshold, execute S205; if not, execute S201.

In step S205, determine that the intelligent lawn mower 20 is at the wire break position of the boundary wire 11, and control the intelligent lawn mower to stop moving. The comparison unit 2742 sends a stop control signal to the control unit to control the intelligent lawn mower 20 to stop moving. In some examples, the control module 27 further sends a position prompt signal to the interactive interface 28 to display the wire break position to the user.

The above shows and describes the basic principles, main features and advantages of the invention hereinafter claimed. Those skilled in the art should understand that the above-mentioned examples do not limit the claimed invention in any form, and all technical solutions obtained by equivalent substitutions or equivalent transformations fall within the protection scope of the claimed invention.

What is claimed is:

1. A self-propelled device system, comprising:
a boundary wire configured to define a work area of a self-propelled device;
a signal transmitting unit, electrically connected with the boundary wire, configured to generate and send a boundary signal to the boundary wire wherein the boundary signal generates a magnetic field when flowing through the boundary wire; and
the self-propelled device, comprising:
a signal receiving module for using the magnetic field generated by the boundary signal to generate a boundary wire inductive signal; and
a control module for determining from the boundary wire inductive signal whether the boundary wire has a wire break,
wherein determining whether the boundary wire has the wire break comprises determining whether a relevant parameter of the boundary wire inductive signal is less than or equal to a predefined threshold, and wherein the self-propelled device is operable in a wire break detection mode and in the wire break detection mode, the self-propelled device returns to the signal transmitting unit and starts to walk along the boundary wire from the signal transmitting unit to determine a wire break position.

2. The self-propelled device system of claim 1, wherein the boundary signal is an alternating current signal.

3. The self-propelled device system of claim 1, wherein the self-propelled device is operable in a plurality of work modes including at least a fully automatic mowing mode and the wire break detection mode.

4. The self-propelled device system of claim 3, wherein the control module is configured to operate the self-propelled device in the wire break detection mode when the relevant parameter of the boundary wire inductive signal is less than or equal to the predefined threshold, to operate the self-propelled device in the fully automatic mowing mode when the relevant parameter of the boundary wire inductive signal is greater than the predefined threshold, and the relevant parameter of the boundary wire inductive signal comprises an amplitude of the boundary wire inductive signal.

5. The self-propelled device system of claim 1, wherein the control module is further configured to use at least one of a sine function or cosine function to obtain an amplitude of the boundary wire inductive signal and the relevant parameter of the boundary wire inductive signal comprises the amplitude of the boundary wire inductive signal.

6. The self-propelled device system of claim 1, wherein, in the wire break detection mode, the self-propelled device is further caused to determine that a position of the boundary wire where the self-propelled device is located is the wire break position when an amplitude of the boundary wire inductive signal is less than or equal to a further predefined threshold.

7. The self-propelled device system of claim 1, further comprising an interactive interface communicatively connected with the control module configured to display operating status information of the self-propelled device and to receive user input from a user to control a start and a work mode of the self-propelled device.

8. The self-propelled device system of claim 7, wherein the control module is configured to send a wire break prompt signal to the interactive interface to remind the user that the boundary wire has the wire break when the relevant parameter of the boundary wire inductive signal is less than or equal to the predefined threshold.

9. The self-propelled device system of claim 8, wherein the self-propelled device further comprises a mobile station to capture at least one of a Global navigation satellite system position (GNSS position) or a Global Positioning System position GPS position) of the self-propelled device and the control module is configured to obtain the GNSS position or the GPS position of the self-propelled device and output a corresponding control instruction to a walking assembly of the self-propelled device to control the self-propelled device to move to the signal transmitting unit.

10. The self-propelled device system of claim 7, wherein the control module is configured to send a position prompt signal to the interactive interface to prompt the user of the wire break position of the boundary wire when the relevant parameter of the boundary wire inductive signal is less than or equal to the predefined threshold.

11. The self-propelled device system of claim 7, wherein the interactive interface is provided on a mobile terminal.

12. The self-propelled device system of claim 1, wherein the self-propelled device is an intelligent lawn mower.

13. A wire break detection method for a boundary wire of a self-propelled device system comprising a self-propelled device, the boundary wire configured to define a work area of the self-propelled device, and a signal transmitting unit, electrically connected with the boundary wire, for generating and sending a boundary signal to the boundary wire wherein the boundary signal generates a magnetic field when flowing through the boundary wire, the wire break detection method comprising:

using the magnetic field generated by the boundary signal to generate a boundary wire inductive signal;

calculating an amplitude of the boundary wire inductive signal;

determining that the boundary wire has a wire break when the amplitude of the boundary wire inductive signal is less than or equal to a first predefined threshold;

returning the self-propelled device to the signal transmitting unit when it is determined that the boundary wire has a wire break; and walking the self-propelled device along the boundary wire from the signal transmitting unit to determine a wire break position.

14. The wire break detection method of claim 13, further comprising controlling the self-propelled device to walk along the boundary wire from the signal transmitting unit and determining that a position of the boundary wire where the self-propelled device is located is the wire break position when the amplitude of the boundary wire inductive signal is less than or equal to a second predefined threshold.

* * * * *